(12) United States Patent
Huang et al.

(10) Patent No.: US 12,184,170 B2
(45) Date of Patent: Dec. 31, 2024

(54) COMPARATOR-BASED SWITCHED-CAPACITOR CIRCUIT AND CURRENT SOURCE THEREOF

(71) Applicant: REALTEK SEMICONDUCTOR CORPORATION, Hsinchu (TW)

(72) Inventors: Shih-Hsiung Huang, Hsinchu (TW); Wei-Cian Hong, Hsinchu (TW)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 56 days.

(21) Appl. No.: 18/086,720

(22) Filed: Dec. 22, 2022

(65) Prior Publication Data
US 2023/0308015 A1    Sep. 28, 2023

(30) Foreign Application Priority Data

Mar. 22, 2022 (TW) ................................. 111110683

(51) Int. Cl.
*H02M 3/07*    (2006.01)
*H03K 5/24*    (2006.01)

(52) U.S. Cl.
CPC ............... *H02M 3/07* (2013.01); *H03K 5/24* (2013.01)

(58) Field of Classification Search
CPC ........ H02M 3/07; H02M 1/167; H02M 1/361; H03K 5/24
See application file for complete search history.

(56) References Cited

U.S. PATENT DOCUMENTS

| | | | |
|---|---|---|---|
| 8,686,888 B2 | 4/2014 | Chou et al. | |
| 2016/0011615 A1* | 1/2016 | Hu | G05F 1/565 323/281 |
| 2022/0190714 A1* | 6/2022 | Ye | H02M 1/007 |
| 2023/0099011 A1* | 3/2023 | Das | H03M 1/462 341/155 |
| 2023/0208427 A1* | 6/2023 | Fulde | H03M 1/0607 341/155 |
| 2023/0308110 A1* | 9/2023 | Huang | H03M 1/167 |

OTHER PUBLICATIONS

A.M. Abo, P.R. Gray"A 1.5-V, 10-bit, 14.3-MS/s CMOS pipeline analog-to-digital converter" IEEE Journal of Solid-State Circuits ( vol. 34, Issue: 5, May 1999).

Mohammad Taherzadeh-Sani; Anas A. Hamoui"Area and Power Optimization of High-Order Gain Calibration in Digitally-Enhanced Pipelined ADCs" IEEE Transactions on Very Large Scale Integration (VLSI) Systems (vol. 18, Issue: 4, Apr. 2010).

* cited by examiner

*Primary Examiner* — Sibin Chen
(74) *Attorney, Agent, or Firm* — WPAT, PC

(57) ABSTRACT

A comparator-based switched-capacitor circuit has a first output terminal and a second output terminal, and includes a switch-capacitor network, a first current source, and a second current source. Each of the first current source and the second current source includes a first transistor, a second transistor, a capacitor, and a buffer circuit. The first transistor has a first source, a first drain, and a first gate. The first drain is coupled to the first output terminal, the first source is coupled to a reference voltage, and the first gate is coupled to the switch-capacitor network. The second transistor has a second source, a second drain, and a second gate. The second source is coupled to the first output terminal. The capacitor is coupled between the second gate and the second source. The buffer circuit is coupled between the second source and the second drain.

10 Claims, 3 Drawing Sheets

COMPARATOR-BASED SWITCHED-CAPACITOR CIRCUIT AND CURRENT SOURCE THEREOF

BACKGROUND OF THE INVENTION

1. Field of the Invention

The present invention generally relates to a switched-capacitor circuit (SC circuit), and, more particularly, to a comparator-based SC circuit and a current source thereof.

2. Description of Related Art

FIG. 1 shows a conventional comparator-based SC circuit, which is also referred to as a zero-crossing-based circuit (ZCBC). The SC circuit 100 includes a comparator 110, a current source 120, a capacitor C1, a capacitor C2, a load capacitor CL, and a switch SW. Various circuits can be built based on the SC circuit 100, such as a multiplying digital-to-analog converter (multiplying DAC) of a pipelined analog-to-digital converter (pipelined ADC, also referred to as pipeline ADC).

The comparator 110 compares the voltage Vx at the positive input terminal with the reference voltage Vcm at the negative input terminal to generate the control signal Dc0, which controls the output current of the current source 120 to control the magnitude of the output voltage Vo (i.e., the terminal voltage of the load capacitor CL). When the switch SW is turned on, the output voltage Vo is reset to the power supply voltage VDD.

The current source 120 is usually embodied by a Metal-Oxide-Semiconductor Field-Effect Transistor (MOSFET), and the output voltage Vo is the drain voltage of the transistor. However, as the drain-source current of the current source 120 (Ids, which is the output current of the current source 120) is dependent on the drain-source voltage (Vds), the output current of the current source 120 is affected by the output voltage Vo, which decreases the linearity of the SC circuit 100.

SUMMARY OF THE INVENTION

In view of the issues of the prior art, an object of the present invention is to provide a comparator-based SC circuit and a current source thereof, so as to make an improvement to the prior art.

According to one aspect of the present invention, a comparator-based SC circuit is provided. The comparator-based SC circuit has a first input terminal, a second input terminal, a first output terminal, and a second output terminal, and includes a comparator, a first switch, a second switch, a third switch, a fourth switch, a fifth switch, a sixth switch, a seventh switch, an eighth switch, a ninth switch, a tenth switch, a first capacitor, a second capacitor, a third capacitor, a fourth capacitor, a first transistor, a second transistor, a fifth capacitor, a first buffer circuit, a third transistor, a fourth transistor, a sixth capacitor, and a second buffer circuit. The first capacitor has a first end and a second end. The first end is coupled to the first input terminal through the first switch and coupled to the first output terminal through the fourth switch; the second end is coupled to the comparator and coupled to a first reference voltage through the third switch. The second capacitor has a third end and a fourth end. The third end is coupled to the first input terminal through the second switch and coupled to the first reference voltage through the fifth switch; the fourth end is coupled to the comparator and coupled to the first reference voltage through the third switch. The third capacitor has a fifth end and a sixth end. The fifth end is coupled to the second input terminal through the sixth switch and coupled to the second output terminal through the ninth switch; the sixth end is coupled to the comparator and coupled to the first reference voltage through the eighth switch. The fourth capacitor has a seventh end and an eighth end. The seventh end is coupled to the second input terminal through the seventh switch and coupled to the first reference voltage through the tenth switch; the eighth end is coupled to the comparator and coupled to the first reference voltage through the eighth switch. The first transistor has a first source, a first drain, and a first gate. The first drain is coupled to the first output terminal, the first source is coupled to a second reference voltage, and the first gate is coupled to the comparator. The second transistor has a second source, a second drain, and a second gate. The second source is coupled to the first output terminal. The fifth capacitor is coupled between the second gate and the second source. The first buffer circuit is coupled between the first output terminal and the second drain. The third transistor has a third source, a third drain, and a third gate. The third drain is coupled to the second output terminal, the third source is coupled to a third reference voltage, and the third gate is coupled to the comparator. The fourth transistor has a fourth source, a fourth drain, and a fourth gate. The fourth source is coupled to the second output terminal. The sixth capacitor is coupled between the fourth gate and the fourth source. The second buffer circuit is coupled between the second output terminal and the fourth drain.

According to another aspect of the present invention, a current source is provided. The current source has a first input terminal and a first output terminal, and includes a first transistor, a second transistor, a capacitor, and a buffer circuit. The first transistor has a first gate, a first source, and a first drain. The first gate is coupled to the first input terminal, the first source is coupled to a reference voltage, and the first drain is coupled to the first output terminal. The second transistor has a second gate, a second source, and a second drain. The second source is coupled to the first output terminal. The capacitor is coupled between the second gate and the second source. The buffer circuit has a second input terminal and a second output terminal. The second input terminal is coupled to the second source, and the second output terminal is coupled to the second drain.

According to still another aspect of the present invention, a comparator-based SC circuit is provided. The comparator-based SC circuit has a first input terminal, a second input terminal, a first output terminal, and a second output terminal, and includes a comparator, a first switch, a second switch, a third switch, a fourth switch, a fifth switch, a sixth switch, a seventh switch, an eighth switch, a ninth switch, a tenth switch, a first current source, a second current source, a first capacitor, a second capacitor, a third capacitor, and a fourth capacitor. The first current source is coupled to the comparator and the first output terminal. The second current source is coupled to the comparator and the second output terminal. The first capacitor has a first end and a second end. The first end is coupled to the first input terminal through the first switch and coupled to the first output terminal through the fourth switch; the second end is coupled to the comparator and coupled to a first reference voltage through the third switch. The second capacitor has a third end and a fourth end. The third end is coupled to the first input terminal through the second switch and coupled to the first reference voltage through the fifth switch; the fourth end is coupled to the comparator and coupled to the first reference voltage through the third switch. The third capacitor has a fifth end and a sixth end. The fifth end is coupled to the second input terminal through the sixth switch and coupled to the second output terminal through the ninth switch; the sixth end is coupled to the comparator and coupled to the first reference voltage through the eighth switch. The fourth capacitor has a seventh end and an eighth end. The seventh end is coupled to the second input terminal through the seventh switch and coupled to the first reference voltage through the tenth switch; The eighth end is coupled to the comparator and coupled to the first reference voltage through the eighth switch. The first current source includes a first transistor, a second transistor, a fifth capacitor, and a buffer circuit. The first transistor has a first source, a first drain, and a first gate. The first drain is coupled to the first output terminal, the first source is coupled to a second reference voltage, and the first gate is coupled to the comparator. The second transistor has a second source, a second drain, and a second gate. The second source is coupled to the first output terminal. The fifth capacitor is coupled between the second gate and the second source. The buffer circuit has a third input terminal and a third output terminal. The third input terminal is coupled to the second source, and the third output terminal is coupled to the second drain.

The technical means embodied in the embodiments of the present invention can solve at least one of the problems of the prior art. Therefore, the present invention has better linearity than the prior art.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a comparator-based SC circuit and a current source thereof. On account of that some or all elements of the comparator-based SC circuit and the current source thereof could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

Figure 1:
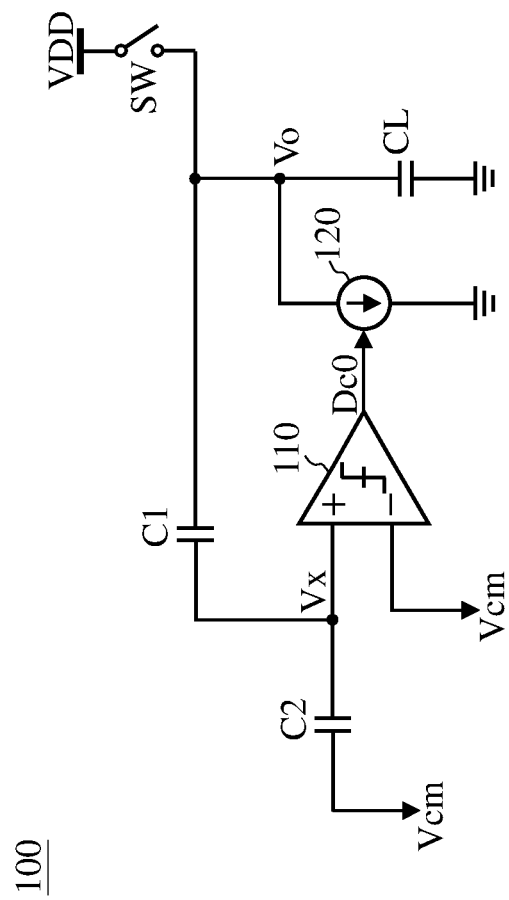
FIG. 1 shows a conventional comparator-based SC circuit.
Figure 2:
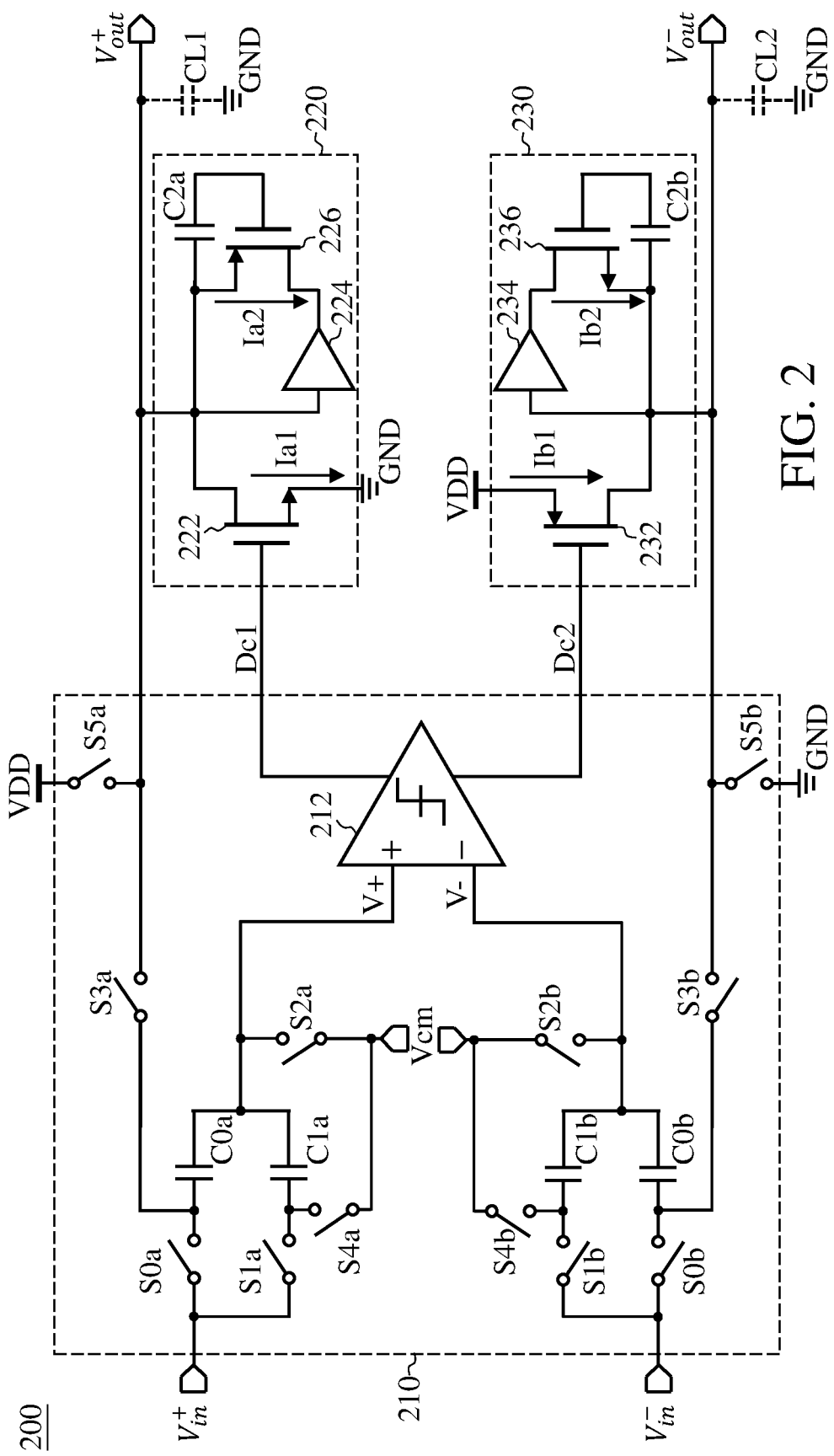
FIG. 2 is a circuit diagram of a comparator-based SC circuit according to an embodiment of the present invention.

FIG. 2 is a circuit diagram of a comparator-based SC circuit according to an embodiment of the present invention. The SC circuit 200 includes a switch-capacitor network 210, a current source 220, and a current source 230. The SC circuit 200 has a first input terminal (i.e., the terminal receiving the input signal $V_{in}^-$), a second input terminal (i.e., the terminal receiving the input signal $V_{in}^-$), a first output terminal (i.e., the terminal outputting the output signal $V_{out}^+$), and a second output terminal (i.e., the terminal outputting the output signal $V_{out}^-$). The current source 220 is coupled between the first output terminal and the ground level GND. The current source 230 is coupled between the power supply voltage VDD and the second output terminal. The load capacitor CL1 is coupled between the first output terminal and the ground level GND. The load capacitor CL2 is coupled between the second output terminal and the ground level GND. The SC circuit 200 samples the differential input signal Vin (including the input signals $V_{in}^+$ and $V_{in}^-$) in a sampling phase and outputs the differential output signal $V_{out}$ (including the output signals $V_{out}^+$ and $V_{out}^-$) in a holding phase.

The switch-capacitor network 210 includes a comparator 212, a capacitor C0a, a capacitor C1a, a capacitor C0b, a capacitor C1b, switches S0a-S5a, and switches S0b-S5b. The reference voltage Vcm is the common mode voltage of the input signals $V_{in}^+$ and $V_{in}^-$. In some embodiments, the capacitance values of the capacitors C0a, C1a, C0b, and C1b are substantially the same.

One end of the capacitor C0a is coupled to the first input terminal through the switch S0a and coupled to the first output terminal through the switch S3a; the other end of the capacitor C0a is coupled to the comparator 212 and coupled to the reference voltage Vcm through the switch S2a. One end of the capacitor C1a is coupled to the first input terminal through the switch S1a and coupled to the reference voltage Vcm through the switch S4a; the other end of the capacitor C1a is coupled to the comparator 212 and coupled to the reference voltage Vcm through the switch S2a. One end of the capacitor C0b is coupled to the second input terminal through the switch S0b and coupled to the second output terminal through the switch S3b; the other end of the capacitor C0b is coupled to the comparator 212 and coupled to the reference voltage Vcm through the switch S2b. One end of the capacitor C1b is coupled to the second input terminal through the switch S1b and coupled to the reference voltage Vcm through the switch S4b; the other end of the capacitor C1b is coupled to the comparator 212 and coupled to the reference voltage Vcm through the switch S2b.

The SC circuit 200 operates alternately in the sampling phase and the holding phase. In the sampling phase, the switch S0a, the switch S1a, the switch S2a, the switch S0b, the switch S1b, and the switch S2b are turned on, and the switch S3a, the switch S4a, the switch S3b, and the switch S4b are turned off. In the holding phase, the switch S3a, the switch S4a, the switch S3b, and the switch S4b are turned on, and the switch S0a, the switch S1a, the switch S2a, the switch S0b, the switch S1b, and the switch S2b are turned off.

Figure 3:
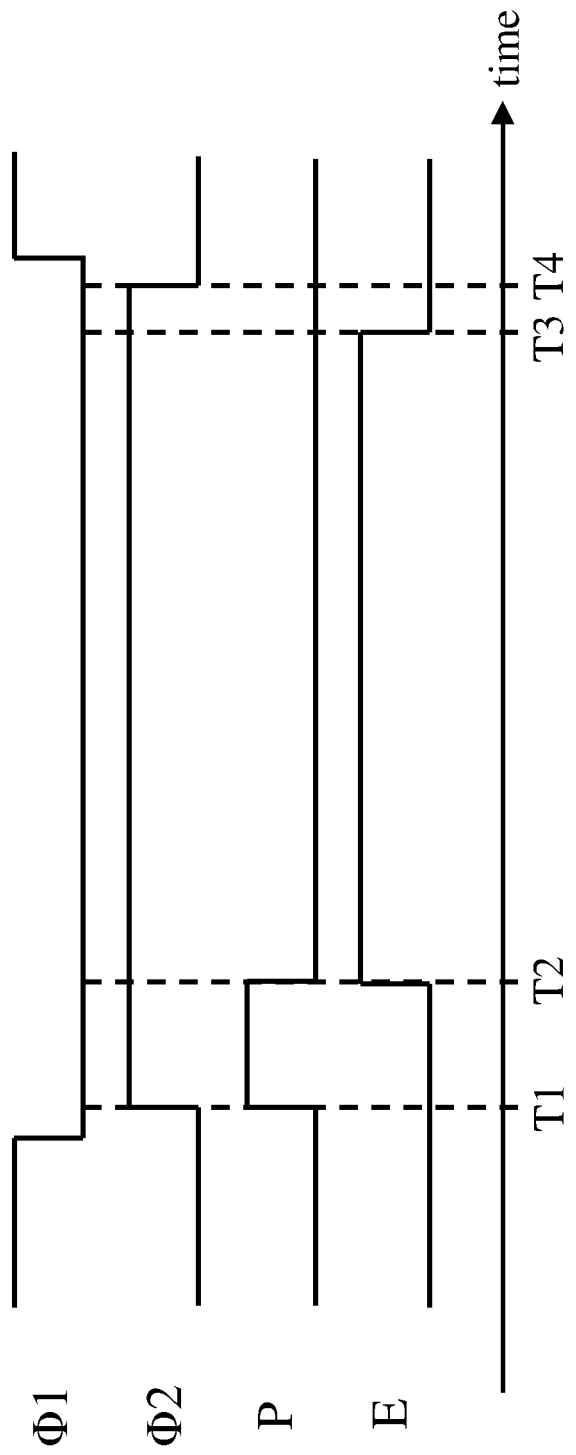
FIG. 3 is a timing diagram according to an embodiment of the present invention.

FIG. 3 is a timing diagram according to an embodiment of the present invention. The sampling phase corresponds to the clock Φ1 being at the first level (e.g., a high level), and the holding phase corresponds to the clock Φ2 being at the first level (e.g., between the time point T1 and the time point T4). The holding phase includes two sub-phases: the phase P and the phase E. Please refer to FIG. 2 and FIG. 3 at the same time. The switch S5a and the switch S5b are turned on for a predetermined time period (T2–T1) in the phase P to reset the first output terminal and the second output terminal (the switch S5a and the switch S5b are turned off at other times), and then the current source 220 and the current source 230 are turned on (i.e., supplying current) in the phase E (between the time point T2 and the time point T3) to discharge the load capacitor CL1 and charge the load capacitor CL2, respectively. The voltage V+ and the voltage V− are the input voltages of the comparator 212. The comparator 212 compares the voltage V+ and the voltage V− and outputs the control signal Dc1 and the control signal Dc2. When V+≥V−, the control signal Dc1 is at the first level (e.g., the high level or logic 1), and the control signal Dc2 is at the second level (e.g., a low level or logic 0). When V+<V−, the control signal Dc1 is at the second level, and the control signal Dc2 is at the first level.

The voltage V+ varies with the output signal $V_{out}^+$, and the voltage V− varies with the output signal $V_{out}^-$. The time point T3 corresponds to the reverse of the voltages at the input terminals of the comparator 212 (i.e., from V+≥V− to V+<V−, and vice versa); that is, the current source 220 and the current source 230 are turned off (stop supplying current) at the time point T3.

The input terminal of the current source 220 (i.e., the gate of the N-channel Metal-Oxide-Semiconductor Field-Effect Transistor (NMOS transistor for short) 222) is coupled or electrically connected to the comparator 212, and the output terminal of the current source 220 (i.e., the drain of the NMOS transistor 222 and the source of the P-channel Metal-Oxide-Semiconductor Field-Effect Transistor (PMOS transistor for short) 226) is coupled or electrically connected to the first output terminal. The input terminal of the current source 230 (i.e., the gate of the PMOS transistor 232) is coupled or electrically connected to the comparator 212, and the output terminal of the current source 230 (i.e., the drain of the PMOS transistor 232 and the source of the NMOS transistor 236) is coupled or electrically connected to the second output terminal.

The current source 220 includes the NMOS transistor 222, a buffer circuit 224, the PMOS transistor 226, and a capacitor C2a. The gate of the NMOS transistor 222 is coupled or electrically connected to the comparator 212, the source of the NMOS transistor 222 is coupled or electrically connected to the ground level GND, and the drain of the NMOS transistor 222 is coupled or electrically connected to the first output terminal. The gate of the PMOS transistor 226 is coupled or electrically connected to one end of the capacitor C2a, and the source of the PMOS transistor 226 is coupled or electrically connected to the other end of the capacitor C2a. The capacitor C2a is used to bias PMOS transistor 226. The input terminal of the buffer circuit 224 is coupled or electrically connected to the first output terminal, and the output terminal of the buffer circuit 224 is coupled or electrically connected to the drain of the PMOS transistor 226. The buffer circuit 224 is a circuit capable of performing 1:1 gain conversion or 1:N gain conversion from input to output. The buffer circuit 224 is well known to people having ordinary skill in the art, and the details are omitted for brevity.

Because the buffer circuit 224 is connected between the source and drain of the PMOS transistor 226, the decrease in the output signal $V_{out}^+$ is amplified and reflected on the source-drain voltage (Vsd) of the PMOS transistor 226, leading to an increase in the current Ia2 flowing through the PMOS transistor 226. As a result, although the current Ia1 flowing through the NMOS transistor 222 becomes smaller due to the decrease in the output signal $V_{out}^+$ (because the drain-source voltage (Vds) of the NMOS transistor 222 becomes smaller), the increased current Ia2 can offset the decrease in the current Ia1, so that the total current (Ia1+Ia2) of the current source 220 is close to a constant value (i.e., less susceptible to the output signal $V_{out}^+$, which means a higher linearity). The gain N of the buffer circuit 224 can be designed according to the properties (e.g., aspect ratio and/or bias condition(s)) of the NMOS transistor 222 and the PMOS transistor 226, so that the total current (Ia1+Ia2) of the current source 220 is close to a constant value. In some embodiments, the gain N may be substantially equal to two.

The current source 230 includes the PMOS transistor 232, a buffer circuit 234, the NMOS transistor 236, and a capacitor C2b. People having ordinary skill in the art can know the operating principle of the current source 230 based on the above discussions, and the details are omitted for brevity.

Because the output current of the current source 220 (or the current source 230) is not affected by the output signal $V_{out}^+$ (or the output signal $V_{out}^-$), the current source 220 and the current source 230 can also be referred to as constant output current sources.

In some embodiments, the linearity can still be improved when the SC circuit 200 includes only one constant output current source (i.e., the SC circuit 200 includes only one of the current source 220 and the current source 230, and the other of the current source 220 and the current source 230 is embodied by a conventional current source).

Please note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A comparator-based switched-capacitor (SC) circuit having a first input terminal, a second input terminal, a first output terminal, and a second output terminal and comprising:
   a comparator;
   a first switch;
   a second switch;
   a third switch;
   a fourth switch;
   a fifth switch;
   a sixth switch;
   a seventh switch;
   an eighth switch;
   a ninth switch;
   a tenth switch;
   a first capacitor having a first end and a second end, the first end being coupled to the first input terminal through the first switch and coupled to the first output terminal through the fourth switch, the second end being coupled to the comparator and coupled to a first reference voltage through the third switch;
   a second capacitor having a third end and a fourth end, the third end being coupled to the first input terminal through the second switch and coupled to the first reference voltage through the fifth switch, the fourth end being coupled to the comparator and coupled to the first reference voltage through the third switch;

a third capacitor having a fifth end and a sixth end, the fifth end being coupled to the second input terminal through the sixth switch and coupled to the second output terminal through the ninth switch, the sixth end being coupled to the comparator and coupled to the first reference voltage through the eighth switch;

a fourth capacitor having a seventh end and an eighth end, the seventh end being coupled to the second input terminal through the seventh switch and coupled to the first reference voltage through the tenth switch, the eighth end being coupled to the comparator and coupled to the first reference voltage through the eighth switch;

a first transistor having a first source, a first drain, and a first gate, the first drain being coupled to the first output terminal, the first source being coupled to a second reference voltage, and the first gate being coupled to the comparator;

a second transistor having a second source, a second drain, and a second gate, the second source being coupled to the first output terminal;

a fifth capacitor coupled between the second gate and the second source;

a first buffer circuit coupled between the first output terminal and the second drain;

a third transistor having a third source, a third drain, and a third gate, the third drain being coupled to the second output terminal, the third source being coupled to a third reference voltage, and the third gate being coupled to the comparator;

a fourth transistor having a fourth source, a fourth drain, and a fourth gate, the fourth source being coupled to the second output terminal;

a sixth capacitor coupled between the fourth gate and the fourth source; and a second buffer circuit coupled between the second output terminal and the fourth drain.

2. The comparator-based SC circuit of claim 1, wherein the first buffer circuit is configured to amplify a signal at the first output terminal by N times, and the second buffer circuit is configured to amplify a signal at the second output terminal by N times, N being greater than one.

3. The comparator-based SC circuit of claim 2, wherein N is substantially equal to two.

4. A current source having a first input terminal and a first output terminal and comprising:
   a first transistor having a first gate, a first source, and a first drain, wherein the first gate is coupled to the first input terminal, the first source is coupled to a reference voltage, and the first drain is coupled to the first output terminal;
   a second transistor having a second gate, a second source, and a second drain, wherein the second source is coupled to the first output terminal;
   a capacitor coupled between the second gate and the second source and used to bias the second transistor; and
   a buffer circuit having a second input terminal and a second output terminal, wherein the second input terminal is coupled to the second source, and the second output terminal is coupled to the second drain.

5. The current source of claim 4, wherein the second input terminal is further coupled to the first output terminal, and the buffer circuit is configured to amplify a signal at the first output terminal by N times, N being greater than one.

6. The current source of claim 5, wherein N is substantially equal to two.

7. A comparator-based switched-capacitor (SC) circuit having a first input terminal, a second input terminal, a first output terminal, and a second output terminal and comprising:
   a comparator;
   a first switch;
   a second switch;
   a third switch;
   a fourth switch;
   a fifth switch;
   a sixth switch;
   a seventh switch;
   an eighth switch;
   a ninth switch;
   a tenth switch;
   a first current source coupled to the comparator and the first output terminal;
   a second current source coupled to the comparator and the second output terminal;
   a first capacitor having a first end and a second end, the first end being coupled to the first input terminal through the first switch and coupled to the first output terminal through the fourth switch, the second end being coupled to the comparator and coupled to a first reference voltage through the third switch;
   a second capacitor having a third end and a fourth end, the third end being coupled to the first input terminal through the second switch and coupled to the first reference voltage through the fifth switch, the fourth end being coupled to the comparator and coupled to the first reference voltage through the third switch;
   a third capacitor having a fifth end and a sixth end, the fifth end being coupled to the second input terminal through the sixth switch and coupled to the second output terminal through the ninth switch, the sixth end being coupled to the comparator and coupled to the first reference voltage through the eighth switch; and
   a fourth capacitor having a seventh end and an eighth end, the seventh end being coupled to the second input terminal through the seventh switch and coupled to the first reference voltage through the tenth switch, the eighth end being coupled to the comparator and coupled to the first reference voltage through the eighth switch;

wherein the first current source comprises:
   a first transistor having a first source, a first drain, and a first gate, the first drain being coupled to the first output terminal, the first source being coupled to a second reference voltage, and the first gate being coupled to the comparator;
   a second transistor having a second source, a second drain, and a second gate, the second source being coupled to the first output terminal;
   a fifth capacitor coupled between the second gate and the second source; and
   a buffer circuit having a third input terminal and a third output terminal, the third input terminal being coupled to the second source, and the third output terminal being coupled to the second drain.

8. The comparator-based SC circuit of claim 7, wherein the third input terminal is further coupled to the first output terminal, and the buffer circuit is configured to amplify a signal at the first output terminal by N times, N being greater than one.

9. The comparator-based SC circuit of claim 8, wherein N is substantially equal to two.

10. The comparator-based SC circuit of claim 8, wherein the buffer circuit is a first buffer circuit, and the second current source comprises:
- a third transistor having a third source, a third drain, and a third gate, the third drain being coupled to the second output terminal, the third source being coupled to a third reference voltage, and the third gate being coupled to the comparator;
- a fourth transistor having a fourth source, a fourth drain, and a fourth gate, the fourth source being coupled to the second output terminal;
- a sixth capacitor coupled between the fourth gate and the fourth source; and
- a second buffer circuit having a fourth input terminal and a fourth output terminal, the fourth input terminal being coupled to the fourth source, and the fourth output terminal being coupled to the fourth drain.

* * * * *